United States Patent
Kim et al.

(10) Patent No.: US 7,531,902 B2
(45) Date of Patent: May 12, 2009

(54) MULTI-LAYERED METAL LINE OF SEMICONDUCTOR DEVICE HAVING EXCELLENT DIFFUSION BARRIER AND METHOD FOR FORMING THE SAME

(75) Inventors: Jeong Tae Kim, Kyoungki-do (KR); Baek Mann Kim, Kyoungki-do (KR); Soo Hyun Kim, Seoul (KR); Young Jin Lee, Kyoungki-do (KR); Dong Ha Jung, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 62 days.

(21) Appl. No.: 11/755,814

(22) Filed: May 31, 2007

(65) Prior Publication Data

US 2008/0157368 A1 Jul. 3, 2008

(30) Foreign Application Priority Data

Dec. 28, 2006 (KR) .................. 10-2006-0137251

(51) Int. Cl.
*H01L 23/48* (2006.01)
*H01L 21/4763* (2006.01)

(52) U.S. Cl. ............... 257/751; 257/764; 257/E23.169; 257/E21.584; 438/627; 438/643; 438/648

(58) Field of Classification Search ................. 257/751, 257/758, 764, E23.169, E21.584; 438/643, 438/653, 656, 627

See application file for complete search history.

(56) References Cited

U.S. PATENT DOCUMENTS

| 6,753,610 | B1* | 6/2004 | Fukiage ................... 257/762 |
| 7,015,527 | B2* | 3/2006 | Yang et al. .............. 257/306 |
| 7,449,409 | B2* | 11/2008 | Barth et al. ............. 438/627 |
| 2003/0181031 | A1* | 9/2003 | Kojima et al. ........... 438/627 |
| 2006/0024953 | A1* | 2/2006 | Papa Rao et al. ........ 438/629 |
| 2006/0258150 | A1* | 11/2006 | Raaijmakers et al. ..... 438/627 |

FOREIGN PATENT DOCUMENTS

KR  2003-0002143 A  1/2003

* cited by examiner

*Primary Examiner*—Tuan N. Quach
(74) *Attorney, Agent, or Firm*—Ladas & Parry LLP

(57) ABSTRACT

A multi-layered metal line of a semiconductor device has a lower metal line and an upper metal line. The upper metal line includes a diffusion barrier, which is made of a stack of a first $WN_x$ layer, a $WC_yN_x$ layer and a second $WN_x$ layer.

27 Claims, 3 Drawing Sheets

MULTI-LAYERED METAL LINE OF SEMICONDUCTOR DEVICE HAVING EXCELLENT DIFFUSION BARRIER AND METHOD FOR FORMING THE SAME

CROSS-REFERENCE TO RELATED APPLICATION

The present application claims priority to Korean patent application number 10-2006-0137251 filed on Dec. 28, 2006, which is incorporated herein by reference in its entirety.

BACKGROUND OF THE INVENTION

The present invention relates to a multi-layered metal line of a semiconductor device and a method for forming the same, and more particularly to a multi-layered metal line of a semiconductor device, which has an excellent diffusion barrier and a method for forming the same.

Memory cells in a highly integrated semiconductor device are formed in a stacked structure in order to meet the high operational speed requirements. Further, a metal line for carrying the electric signals to the memory cells are formed in a multi-layered structure. The multi-layered metal lines provides advantageous design flexibility and allows more leeway in setting the margins for the wiring resistance, the current capacity, etc.

Aluminum has been the choice material for a metal line for its superior electric conductivity and the ease of being applied in a fabrication process. However, it is not the case when the design rule is so decreased for higher integration of a semiconductor device, because the resistance of the metal line made of aluminum increases to a undesirable level. To cope with this problem, copper is used as the material for a metal line instead of aluminum as the resistance of copper is relatively lower.

In a process for forming a metal line using copper, the copper, unlike aluminum, diffuses through an interlayer dielectric. The copper diffused to a semiconductor substrate acts as deep-level impurities in the semiconductor substrate and induces a leakage current. Therefore, in the case of a metal line formed using copper, a diffusion barrier must be necessarily formed not only where the copper comes into contact with hetero-metal but also on a portion of an interlayer dielectric on which the copper is formed in order to decrease the leakage current due to diffusion of copper.

In general, as a diffusion barrier for a metal line formed using copper, a Ti/TiN layer or a Ta/TaN layer is mainly used.

Nevertheless, the Ti/TiN layer or Ta/TaN layer, which is used as a diffusion barrier in the metal line formed using copper, is significantly decreased in suppressing the diffusion of copper in an ultra-highly integrated device below 40 nm and cannot properly perform its function as a copper diffusion barrier.

SUMMARY OF THE INVENTION

An embodiment of the present invention is directed to a multi-layered metal line of a semiconductor device which has a diffusion barrier having superior capability for preventing diffusion of copper and a method for forming the same.

In one embodiment, there is provided a multi-layered metal line of a semiconductor device having a lower metal line and an upper metal line, wherein the upper metal line includes a diffusion barrier which is made of a stack of a first $WN_x$ layer, a $WC_yN_x$ layer and a second $WN_x$ layer.

The first $WN_x$ layer has a thickness of 10~200 Å.
The composition ratio x in the first $WN_x$ layer is 0.1~10.
The $WC_yN_x$ layer has a thickness of 5~50 Å.
The second $WN_x$ layer has a thickness of 10~200 Å.

In another embodiment, there is provided a method for forming a multi-layered metal line of a semiconductor device, including a process for forming a diffusion barrier to prevent diffusion of a metal line, the process for forming a diffusion barrier comprising the steps of depositing a first $WN_x$ layer; surface-treating the first $WN_x$ layer; and depositing a second $WN_x$ layer on the first $WN_x$ layer which is surface-treated.

The first $WN_x$ layer is formed through CVD or ALD.
The first $WN_x$ layer is formed to have a thickness of 10~200 Å.
The composition ratio x in the first $WN_x$ layer is 0.1~10.
The step of surface-treating the first $WN_x$ layer comprises the step of forming a $WC_yN_x$ layer on a surface of the first $WN_x$ layer through heat treatment or plasma treatment under a high temperature using a hydrocarbon-based source gas.
The hydrocarbon-based gas is $CH_3$ or $C_2H_5$ gas.
The plasma treatment is implemented under an atmosphere of $CH_3$ or $C_2H_5$ at conditions including a temperature of 200~500° C., a pressure of 1~100 torr and an RF power of 0.1~1 kW.
The $WC_yN_x$ layer is formed to have a thickness of 5~50 Å.
The second $WN_x$ layer is formed through CVD or ALD.
The second $WN_x$ layer is formed to have a thickness of 10~200 Å.

In still another embodiment, there is provided a method for forming a multi-layered metal line of a semiconductor device, comprising the steps of forming an interlayer dielectric having a damascene pattern for delimiting a metal line forming region, on a semiconductor substrate; depositing a first $WN_x$ layer on the interlayer dielectric including the damascene pattern; surface-treating the first $WN_x$ layer; depositing a second $WN_x$ layer on the surface-treated first $WN_x$ layer and thereby forming a diffusion barrier composed of the surface-treated first $WN_x$ layer and the second $WN_x$ layer; and forming a wiring metal layer on the diffusion barrier to fill the damascene pattern.

The damascene pattern is a single type or a dual type.
The single type damascene pattern has a trench.
The dual type damascene pattern has a via hole and a trench.
The first $WN_x$ layer is formed through CVD or ALD.
The first $WN_x$ layer is formed to have a thickness of 10~200 Å.
The composition ratio x in the first $WN_x$ layer is 0.1~10.
The step of surface-treating the first $WN_x$ layer comprises the step of forming a $WC_yN_x$ layer on a surface of the first $WN_x$ layer through heat treatment or plasma treatment under a high temperature using a hydrocarbon-based source gas.
The hydrocarbon-based gas is $CH_3$ or $C_2H_5$ gas.
The plasma treatment is implemented under an atmosphere of $CH_3$ or $C_2H_5$ at conditions including a temperature of 200~500° C., a pressure of 1~100 torr and an RF power of 0.1~1 kW.
The $WC_yN_x$ layer is formed to have a thickness of 5~50 Å.
The second $WN_x$ layer is formed through CVD or ALD.
The second $WN_x$ layer is formed to have a thickness of 10~200 Å.
The wiring metal layer is made of a copper layer.

DESCRIPTION OF SPECIFIC EMBODIMENTS

In the present invention, as a diffusion barrier comprising a stack of a first $WN_x$ layer, a $WC_yN_x$ layer and a second $WN_x$ layer is used to prevent diffusion of the metal line formed using copper.

Since the $WC_yN_x$ layer has excellent diffusion prevention characteristics, the diffusion barrier made of the stack of the first $WN_x$ layer, the $WC_yN_x$ layer and the second $WN_x$ layer retains excellent capability for preventing diffusion of copper even in an ultra-highly integrated semiconductor device below 40 nm.

Accordingly, in the present invention, in a process for forming a metal line using copper in conformity with the ultra-high integration of a semiconductor device, it is possible to form a metal line having an excellent diffusion barrier, whereby the characteristics of a semiconductor device can be improved.

Hereafter, a method for forming a multi-layered metal line of a semiconductor device in accordance with an embodiment of the present invention will be described in detail with reference to FIGS. 1 through 5.

Figure 1:
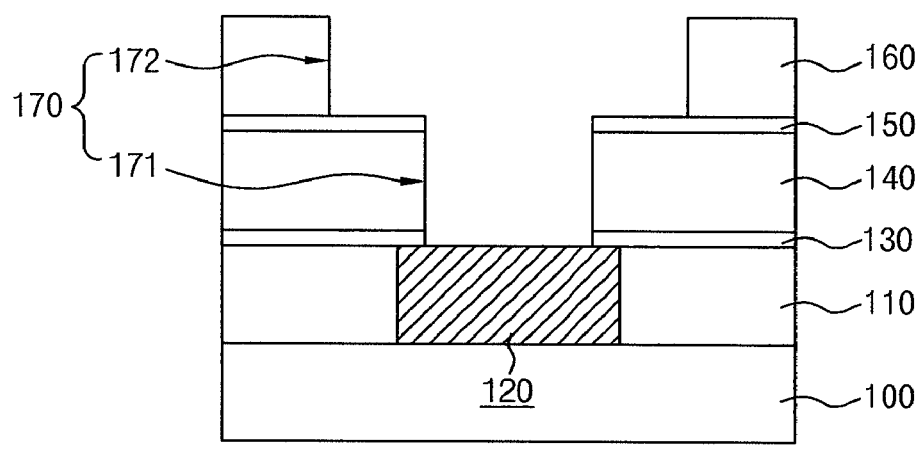
FIGS. 1 through 5 are cross-sectional views illustrating the process steps of a method for forming a multi-layered metal line of a semiconductor device in accordance with an embodiment of the present invention.

Referring to FIG. 1, an interlayer dielectric 110 and a lower metal line 120 made of an aluminum layer are formed on a semiconductor substrate 100. A passivation layer 130 is formed on the interlayer dielectric 110 to prevent the lower metal line 120 from being damaged in a subsequent etching process. The passivation layer 130 is made of a nitride-based layer.

A first insulation layer 140 and an etch barrier 150 for preventing the first insulation layer 140 from being etched in a subsequent process for etching a second insulation layer 160 are sequentially formed on the passivation layer 130. The second insulation layer 160 is then formed on the etch barrier 150. Each of the first and second insulation layers 140 and 160 is made of an oxide-based layer, and the etch barrier 150 is made of a nitride-based layer.

By etching the second insulation layer 160, the etch barrier 150, the first insulation layer 140, and the passivation layer 130, a via hole 171 is defined to expose the lower metal line 120. By additionally etching the second insulation layer 160 over the via hole 171 using the etch barrier 150 as an etch stop layer until the etch barrier 150 is exposed, a trench 172 is formed to delimit (or define) a metal line forming region. In this way, a dual type damascene pattern 170 comprised of the via hole 171 and the trench 172 is formed. Here, while the dual type damascene pattern 170 is formed by defining the trench 172 after defining the via hole 171, the sequence of forming the dual type damascene pattern 170 can be reversed.

Figure 2:
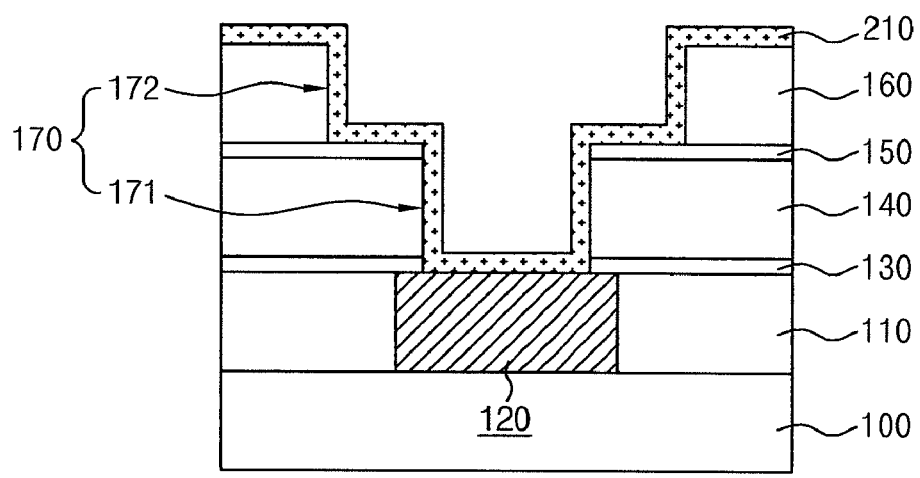

Referring to FIG. 2, a first $WN_x$ layer 210 is deposited on the second insulation layer 160 including the damascene pattern 170 comprised of the via hole 171 and the trench 172 to a thickness of 10~200 Å. The first $WN_x$ layer 210 is formed through a chemical vapor deposition (CVD) or atomic layer deposition (ALD) process. The composition ratio x in the first $WN_x$ layer 210 is in the range of 0.1~10.

Figure 3:
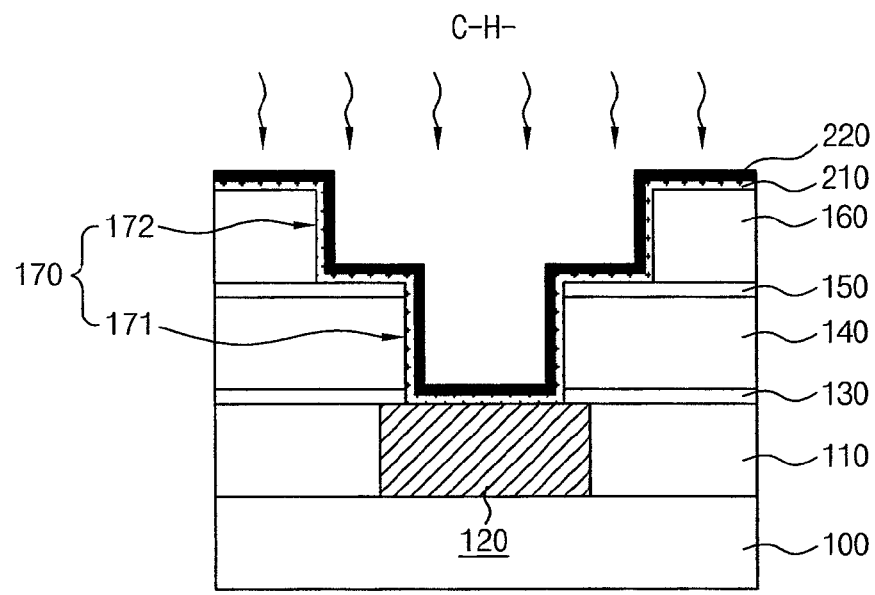

Referring to FIG. 3, by surface-treating the first $WN_x$ layer 210, a $WC_yN_x$ layer 220 is formed on the surface of the first $WN_x$ layer 210 to a thickness of 5~50 Å. The surface treatment of the first $WN_x$ layer 210 is implemented through an heat treatment or plasma treatment under high temperature using a hydrocarbon-based gas such as $CH_3$ or $C_2H_5$ gas containing "C—H—". In the case where the surface treatment of the first $WN_x$ layer 210 is implemented through a plasma treatment, the plasma treatment is conducted under an atmosphere of $CH_3$ or $C_2H_5$ at a temperature of 200~500° C., a pressure of 1~100 torr, and an RF power of 0.1~1 kW.

Figure 4:
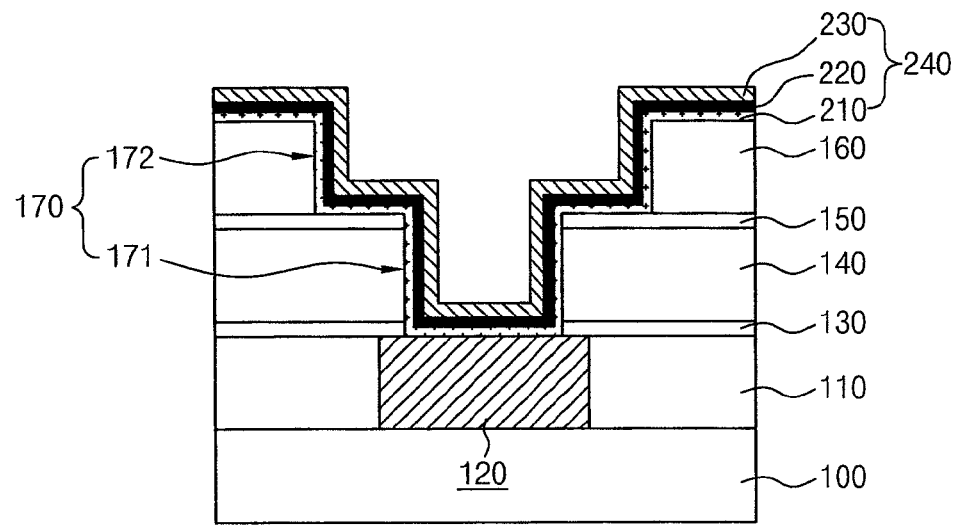

Referring to FIG. 4, a second $WN_x$ layer 230 is deposited on the $WC_yN_x$ layer 220 (which was formed through a surface treatment of the first $WN_x$ layer 210) to a thickness of 10~200 Å. In this way, a diffusion barrier 240 made of a stack of the first $WN_x$ layer 210, the $WC_yN_x$ layer 220, and the second $WN_x$ layer 230 is formed. The second $WN_x$ layer 230 is formed through a CVD or ALD process to improve the adhesion characteristics between a copper layer (to be subsequently formed) and the diffusion barrier 240.

Figure 5:
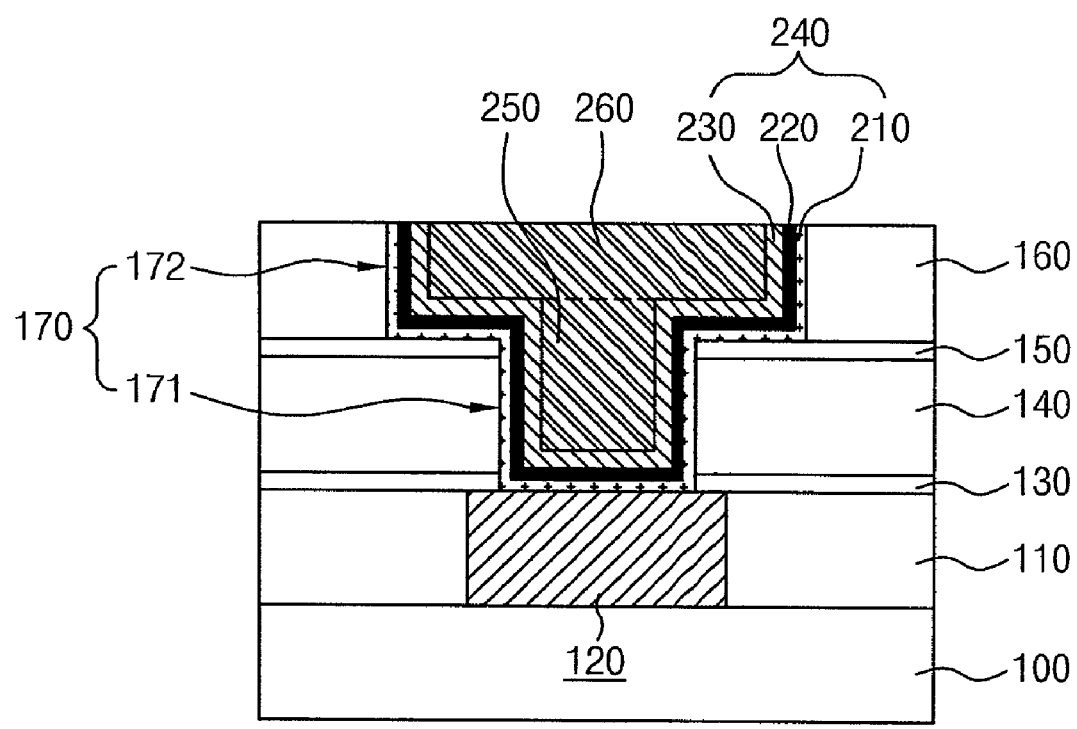

Referring to FIG. 5, a copper layer is deposited on the second $WN_x$ layer 230 to fill the trench 172 including the via hole 171 in which the diffusion barrier 240 made of the stack of the first $WN_x$ layer 210, the $WC_yN_x$ layer 220, and the second $WN_x$ layer 230 is formed. Then, by performing a chemical mechanical polishing process ("CMPing") on the copper layer until the second insulation layer 160 is exposed, a via contact 250 is formed in the via hole 171, and an upper metal line 260 made of copper is formed in the trench 172.

As is apparent from the above description, because the diffusion barrier of the present invention for preventing the diffusion of a copper metal line is formed in a stack structure of a first $WN_x$ layer, a $WC_yN_x$ layer formed through surface treatment of the first $WN_x$ layer, and a second $WN_x$ layer, it is possible to form a diffusion barrier having superior diffusion prevention characteristics. As a consequence, it is possible to form a metal line having an excellent diffusion barrier in an ultra-highly integrated semiconductor device.

As a result, in the present invention, a metal line having an excellent diffusion barrier for copper can be formed in an ultra-highly integrated semiconductor device, whereby the characteristics of the semiconductor device can be improved.

In the above embodiment, a multi-layered metal line was illustrated and explained, which is formed through a dual damascene process wherein a copper layer is deposited in the first insulation layer 140 and the second insulation layer 160 having the dual type damascene pattern 170 including the via hole 171 and the trench 172 and the copper layer is then CMPed to form the via contact 240 in the via hole 171 and the upper metal line 250 in the trench 172. However, it is to be noted that the present invention is not limited to this exemplary embodiment such that the present invention can be applied to a multi-layered metal line which is formed through a single damascene process wherein a copper layer is deposited in an insulation layer having a trench for delimiting (or defining) a metal line forming region and the copper layer is then CMPed to form an upper metal line in the trench.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A multi-layered metal line of a semiconductor device comprising:
   a lower metal line;
   an upper metal line; and
   a diffusion barrier formed between the lower and upper metal lines, wherein the diffusion barrier comprises a stack of a first $WN_x$ layer, a $WC_yN_x$ layer, and a second $WN_x$ layer.

2. The multi-layered metal line according to claim 1, wherein the first $WN_x$ layer has a thickness of 10~200 Å.

3. The multi-layered metal line according to claim 1, wherein the composition ratio x in the first $WN_x$ layer is in the range of 0.1~10.

4. The multi-layered metal line according to claim 1, wherein the $WC_yN_x$ layer has a thickness of 5~50 Å.

5. The multi-layered metal line according to claim 1, wherein the second $WN_x$ layer has a thickness of 10~200 Å.

6. A method for forming a diffusion barrier layer to prevent diffusion of a metal line in a semiconductor device formed with a multi-layered metal line structure, the method for forming a diffusion barrier comprising the steps of:

depositing a first $WN_x$ layer;

surface-treating the first $WN_x$ layer; and depositing a second $WN_x$ layer on the surface-treated first $WN_x$ layer, wherein the step of surface-treating the first $WN_x$ layer comprises the step of: forming a $WC_yN_x$ layer on a surface of the first $WN_x$ layer through an heat treatment plasma treatment under high temperature using a hydrocarbon-based source gas.

7. The method according to claim 6, wherein the first $WN_x$ layer is formed in a CVD or ALD process.

8. The method according to claim 6, wherein the first $WN_x$ layer is formed to a thickness of 10~200 Å.

9. The method according to claim 6, wherein the composition ratio x in the first $WN_x$ layer is 0.1~10.

10. The method according to claim 6, wherein the hydrocarbon-based gas is $CH_3$ or $C_2H_5$ gas.

11. The method according to claim 6, wherein the plasma treatment is implemented under an atmosphere of $CH_3$ or $C_2H_5$ at a temperature of 200~500° C.; a pressure of 1~100 torr, and an RF power of 0.1~1 kW.

12. The method according to claim 6, wherein the $WC_yN_x$ layer is formed to a thickness of 5~50 Å.

13. The method according to claim 6, wherein the second $WN_x$ layer is formed in a CVD or ALD process.

14. The method according to claim 6, wherein the second $WN_x$ layer is formed to a thickness of 10~200 Å.

15. A method for forming a multi-layered metal line of a semiconductor device, comprising the steps of:

forming an interlayer dielectric layer on a semiconductor substrate, the interlayer dielectric layer having a damascene pattern for defining a metal line forming region;

depositing a first $WN_x$ layer on the interlayer dielectric layer including the damascene pattern;

surface-treating the first $WN_x$ layer;

depositing a second $WN_x$ layer on the surface-treated first $WN_x$ layer so as to form a diffusion barrier comprising the surface-treated first $WN_x$ layer and the second $WN_x$ layer; and forming a wiring metal layer on the diffusion barrier to fill the damascene pattern, wherein the step of surface-treating the first $WN_x$ layer comprises the step of: forming a $WC_yN_x$ layer on a surface of the first $WN_x$ layer through an heat treatment or plasma treatment under high temperature using a hydrocarbon-based source gas.

16. The method according to claim 15, wherein the damascene pattern is a single type or a dual type.

17. The method according to claim 16, wherein the single type damascene pattern has a trench.

18. The method according to claim 16, wherein the dual type damascene pattern has a via hole and a trench.

19. The method according to claim 15, wherein the first $WN_x$ layer is formed in a CVD or ALD process.

20. The method according to claim 15, wherein the first $WN_x$ layer is formed to a thickness of 10~200 Å.

21. The method according to claim 15, wherein the composition ratio x in the first $WN_x$ layer is 0.1~10.

22. The method according to claim 15, wherein the hydrocarbon-based gas is $CH_3$ or $C_2H_5$ gas.

23. The method according to claim 15, wherein the plasma treatment is implemented under an atmosphere of $CH_3$ or $C_2H_5$ at a temperature of 200~500° C., a pressure of 1~100 torr, and an RF power of 0.1~1 kW.

24. The method according to claim 15, wherein the $WC_yN_x$ layer is formed to a thickness of 5~50 Å.

25. The method according to claim 15, wherein the second $WN_x$ layer is formed in a CVD or ALD process.

26. The method according to claim 15, wherein the second $WN_x$ layer is formed to a thickness of 10~200 Å.

27. The method according to claim 15, wherein the wiring metal layer is made of a copper layer.

* * * * *